US009865480B2

(12) United States Patent
Choi et al.

(10) Patent No.: US 9,865,480 B2
(45) Date of Patent: Jan. 9, 2018

(54) PRINTED CIRCUIT BOARD INCLUDING UNDER-FILL DAM AND FABRICATION METHOD THEREOF

(75) Inventors: Byung-Ju Choi, Daejeon (KR);
Woo-Jae Jeong, Daejeon (KR);
Bo-Yun Choi, Daejeon (KR);
Kwang-Joo Lee, Daejeon (KR);
Min-Su Jeong, Daejeon (KR)

(73) Assignee: LG CHEM, LTD., Seoul (KR)

( * ) Notice: Subject to any disclaimer, the term of this patent is extended or adjusted under 35 U.S.C. 154(b) by 251 days.

(21) Appl. No.: 13/699,275

(22) PCT Filed: May 11, 2011

(86) PCT No.: PCT/KR2011/003466
§ 371 (c)(1),
(2), (4) Date: Nov. 20, 2012

(87) PCT Pub. No.: WO2011/145828
PCT Pub. Date: Nov. 24, 2011

(65) Prior Publication Data
US 2013/0063917 A1 Mar. 14, 2013

(30) Foreign Application Priority Data

May 20, 2010 (KR) .................. 10-2010-0047318
May 11, 2011 (KR) .................. 10-2011-0044011

(51) Int. Cl.
*H01L 21/60* (2006.01)
*H01L 21/56* (2006.01)
(Continued)

(52) U.S. Cl.
CPC .......... *H01L 21/563* (2013.01); *H05K 3/3452* (2013.01); *H01L 24/13* (2013.01); *H01L 24/16* (2013.01); *H01L 24/32* (2013.01); *H01L 24/81* (2013.01); *H01L 24/83* (2013.01); *H01L 2224/16225* (2013.01); *H01L 2224/26175* (2013.01); *H01L 2224/27013* (2013.01); *H01L 2224/32225* (2013.01); *H01L 2224/73204* (2013.01); *H01L 2224/81191* (2013.01);
(Continued)

(58) Field of Classification Search
CPC ............ H05K 1/18; H05K 1/181; H05K 3/30; H01G 4/30
USPC ........................................... 361/770; 174/260
See application file for complete search history.

(56) References Cited

U.S. PATENT DOCUMENTS

2005/0277245 A1* 12/2005 Ohta ...................... H01L 24/12
438/222
2006/0199920 A1 9/2006 Okada et al.
(Continued)

FOREIGN PATENT DOCUMENTS

CN 101407636 A 4/2009
CN 101553759 A 10/2009
(Continued)

*Primary Examiner* — Jenny L Wagner
*Assistant Examiner* — Michael E Moats, Jr.
(74) *Attorney, Agent, or Firm* — Rothwell, Figg, Ernst & Manbeck, P.C.

(57) ABSTRACT

The present invention relates to an under-fill dam with high detection probability that is composed of a dry film solder resist and provided in the form of a fence around a chip device in order to prevent leaks of an under-fill material filled in a gap between a substrate and the chip device.

13 Claims, 2 Drawing Sheets

(51) Int. Cl.
*H01L 23/00* (2006.01)
*H05K 3/34* (2006.01)

(52) U.S. Cl.
CPC ............... *H01L 2224/83104* (2013.01); *H01L 2224/92125* (2013.01); *H01L 2924/014* (2013.01); *H01L 2924/01012* (2013.01); *H01L 2924/12042* (2013.01); *H01L 2924/14* (2013.01); *H05K 3/3436* (2013.01); *H05K 2201/09909* (2013.01); *H05K 2201/10977* (2013.01)

(56) References Cited

U.S. PATENT DOCUMENTS

2010/0025084 A1\* 2/2010 Ezaki ..................... G03F 7/027
  174/254
2010/0116534 A1\* 5/2010 Choi ..................... H01L 21/563
  174/260

FOREIGN PATENT DOCUMENTS

| | | | |
|---|---|---|---|
| CN | 101740538 A | 6/2010 | |
| JP | H06314873 A | 11/1994 | |
| JP | 08-097341 A | 4/1996 | |
| JP | 2001-159815 A | 6/2001 | |
| JP | 2001159815 \* | 6/2001 | ............... H05K 3/28 |
| JP | 2003304053 A | 10/2003 | |
| JP | 2004-325980 A | 11/2004 | |
| JP | 2007-133108 A | 5/2007 | |
| KR | 10-2010-0053307 A | 5/2010 | |

\* cited by examiner

PRINTED CIRCUIT BOARD INCLUDING UNDER-FILL DAM AND FABRICATION METHOD THEREOF

CROSS REFERENCE TO RELATED APPLICATIONS

This application is a 35 U.S.C. §371 National Phase Entry Application from PCT/KR2011/00346, filed May 11, 2011, and designating the United States, which claims priority under 35 U.S.C. §119 to Korean Patent Application No. 10-2010-0047318 filed on May 20, 2010 and to Korean Patent Application No. 10-2011-0044011 filed on May 11, 2011, which are incorporated herein in their entireties.

FIELD OF THE INVENTION

The present invention relates to a printed circuit board including an under-fill dam and a fabrication method thereof, and more particularly to a printed circuit board including an under-fill dam using a dry film solder resist and a fabrication method thereof.

BACKGROUND OF THE INVENTION

For protection of IC (integrated circuit)-based devices, resin packaging is adopted using a variety of resins, mostly epoxy resins. With a recent trend towards miniaturized and light-weight devices, the IC mounting method prevailingly uses the so-called surface mounting technique, which involves a process of mounting devices such as ICs to a substrate and packaging with a liquid resin (that is, an under-fill process).

Such an under-fill process is an approach to solving problems with thermal/mechanical fatigue, and more specifically, by injecting inorganic particles into a high-adhesiveness polymer material such as an epoxy resin to have a value approximating the thermal expansion coefficient of the solder and then applying the polymer material in a gap between the chip and the printed circuit board. The composite polymer material containing inorganic particles as used in this process is called an "under-fill material".

General under-fill materials are in a liquid state with high fluidity, potentially leaking out on an undesired region and thus causing unwanted contamination, and consequently defective products, or there is difficulty in implementing the high-density mounting technique. To avoid this problem, a method of placing a fence-like dam encompassing the devices has been used.

The conventional dams are formed mostly by using a laminar material formed by punching or a liquid solder resist (e.g., Japanese Patent Laid-Open Publication No. 1996-325476, etc.). However, the conventional dam formation method using a liquid solder resist encounters some problems such as an extremely wide deviation of thickness to implement high-density mounting of ICs, consequently causing leaks of an adhesive (liquid sealant), and a further difficulty of uniformly forming a dam in the case of micronization to a thickness at a micrometer (μm) level.

To solve the problem with the dam formation method using a liquid solder resist, a method of using a dry film solder resist has been suggested. For example, JP No. 1996-097841 or U.S. Patent No. 2010-0116534 discloses a method of forming a dam for preventing the flow of under-fill using a dry film resist. However, the conventional methods are hard to apply in high-density ICs due to some limitations in micronizing of the thickness of the dam, resulting in a failure to form a dam having at least a predetermined height or formation of an extremely uneven dam, particularly in the case of realizing a small thickness.

DETAILED DESCRIPTION OF THE INVENTION

Technical Objectives

It is therefore an object of the present invention to provide a printed circuit board including a fine under-fill dam with uniform thickness and good mechanical properties.

It is another object of the present invention to provide a method for fabricating the printed circuit board.

Accordingly, the present invention provides a printed circuit board that includes an under-fill dam formed along an outer edge of a substrate, where the under-fill dam includes a dry film solder resist, and the dry film solder resist includes a dried or cured material of a photosensitive resin composition, which includes an acid-modified oligomer having a carboxyl group (—COOH) and a photocurable functional group, a photopolymerizable monomer, a thermosetting binder resin, and a pigment.

The present invention also provides a method for fabricating a printed circuit board that includes: (a) laminating a dry film on a substrate, where the dry film includes a dried or cured material of a photosensitive resin composition including an acid-modified oligomer having a carboxyl group (—COOH) and a photocurable functional group, a photopolymerizable monomer, a photoinitiator, a thermosetting binder resin, an organic solvent, and a pigment; (b) exposing the dry film along an outer edge portion of the substrate; and (c) cleaning the exposed dry film.

Technical Solutions

Hereinafter, a detailed description will be given as to a printed circuit board and its fabrication method according to the embodiments of the present invention.

In accordance with one embodiment of the present invention, a printed circuit board that includes an under-fill dam formed along the outer edge of a substrate is provided, where the under-fill dam includes: a dry film solder resist, wherein the dry film solder resist includes a dried or cured material of a photosensitive resin composition, which includes an acid-modified oligomer having a carboxyl group (—COOH) and a photocurable functional group; a photopolymerizable monomer; a thermosetting binder resin; and a pigment.

The use of a dry film solder resist which is prepared from a photosensitive resin composition including, as constitutional ingredients, an acid-modified oligomer having the above-mentioned functional groups, a photopolymerizable monomer, a thermosetting binder resin, and so forth can lead to formation of a thin under-fill dam with uniform thickness. Particularly, the under-fill dam has such good mechanical properties to implement height and strength at predetermined levels or above even with a small thickness, which ultimately prevents leaks of an under-fill material injected or filled into the printed circuit board and minimizes damage to the under-fill dam or deterioration of properties potentially occurring during the under-fill process or the semiconductor fabrication process. The term "under-fill dam" as used herein refers to a defined portion on a substrate or a structure formed along the outer edge of the printed circuit board to prevent leaks of a material injected into a gap between the substrate and the semiconductor chip in the under-fill process.

On the other hand, the printed circuit board may include a substrate and the aforementioned under-fill dam formed along the outer edge of the substrate. Such a printed circuit board may include an electrode pad formed on the substrate, a solder bump formed on the electrode pad, and a semiconductor chip mounted by flip-chip connection via the solder bump. The electrode pad, the solder bump, and the semiconductor chip are not specifically limited and may have a known construction that is generally applicable to printed circuit boards.

As described above, the under-fill dam is to prevent leaks of an under-fill material filled into a gap between the substrate and the semiconductor chip. More specifically, the under-fill dam is positioned between an outer edge of the substrate and an outer edge of the semiconductor chip to prevent the under-fill material from leaking out of the substrate.

Accordingly, the under-fill dam may have a height that is equal to or greater than the distance between the substrate and the semiconductor chip. For example, the under-fill dam formed on the substrate may have the same height as the outermost side of the semiconductor chip (i.e., the side most distant from the substrate).

The under-fill dam may come in different colors, such as white, yellow, green, black, or red, depending on the color of the pigment or other materials used. In particular, an under-fill dam in a white color, reflecting the light, can be superior to those in any other colors with regard to detection probability using AOI (automated optical inspection) equipment as optical equipment.

Further, the under-fill dam may have a different color from the substrate, the solder resist selectively formed on the substrate, or other structures in the printed circuit board. Having the under-fill dam in a different color from the substrate or other structures, such as a solder resist, makes it easier to detect or judge the occurrence of defects from the outer appearance.

The under-fill dam is formed using a dry film solder resist prepared from a photosensitive resin composition containing specific components, so it can realize thickness and uniformity which are hard to implement in the conventional methods. More specifically, the under-fill dam may have a thickness of 10 to 20 µm, preferably 10 to 15 µm, where an error of the thickness (i.e., the difference between the mean and the maximum/minimum thickness) is 3 µm or less.

By using the photosensitive resin composition containing the specific components, the dry film solder resist thus obtained can have good developability, particularly alkaline developability, which makes it easier to form a micro-pattern or a thin dam structure.

More specifically, the photosensitive resin composition may include a photocured material of the acid-modified oligomer and the photopolymerizable monomer, a thermally cured material of the acid-modified oligomer and the thermosetting binder resin, and a pigment. The photopolymerizable monomer and the photosensitive moiety (e.g., double bonds, such as —C═C—, etc.) of the acid-modified oligomer in the photosensitive resin composition are reactive to light to form a crosslink structure during exposure. The thermosetting binder resin and the defined moiety (e.g., carboxyl groups (—COOH), etc.) of the acid-modified oligomer form a crosslink structure in the subsequent process to thermally cure the remainder of the unexposed portion after development with an alkaline development solution. As a result, the dry film solder resist using the photosensitive resin composition can have a network structure with cross-links formed by thermocuring or photocuring of the respective components, thereby implementing a higher degree of crosslinking. Accordingly, the under-fill dam using the dry film solder resist can secure excellence in dimensional stability, thermal resistance, strength, or other mechanical properties.

The photosensitive resin composition may include an acid-modified oligomer having a carboxyl group (—COOH) and a photocurable functional group, a photopolymerizable monomer, a thermosetting binder resin, a pigment, and additionally a photoinitiator and an organic solvent. Optionally, the photosensitive resin composition may further include additives, such as a curing agent for the thermosetting binder resin, a thermosetting binder catalyst, a filler, a leveling agent, and so forth.

Hereinafter, the individual components of the photosensitive resin composition will be described in further detail.

Acid-Modified Oligomer

The photosensitive resin composition includes an acid-modified oligomer having a carboxyl group (—COOH) and a photocurable functional group. The acid-modified oligomer forms cross-links with the other components of the resin composition, that is, the photopolymerizable monomer and/or the thermosetting binder resin by the photocuring mechanism, and contains a carboxyl group to render the resin composition alkaline-developable.

Such an acid-modified oligomer is an oligomer of which the molecular structure contains a carboxyl group and a photocurable functional group, such as, for example, an acrylate group or a photocurable group having an unsaturated double bond, and may include, without specific limitation, any kind of oligomers known to be usable in the photocurable resin composition. For example, the main chain of the acid-modified oligomer may be novolac epoxy or polyurethane, containing a carboxyl group and an acrylate group. The photocurable functional group is preferably an acrylate group. In this case, the acid-modified oligomer can be prepared by copolymerization of a polymerizable monomer having a carboxyl group and a monomer such as an acrylate-based compound.

More specifically, examples of the acid-modified oligomer usable in the resin composition are as follows:

(1) a carboxyl group-containing resin prepared by copolymerization of an unsaturated carboxylic acid (a), such as (meth)acrylic acid, and a compound (b) having an unsaturated double bond, such as styrene, α-methyl styrene, a lower alkyl(meth)acrylate, isobutylene, etc.;

(2) a carboxyl group-containing photosensitive resin prepared by reacting a compound (e.g., glycidyl(meth)acrylate) having an ethylenically unsaturated group, such as a vinyl group, an allyl group, a (meth)acryloyl group, etc., and a reactive group, such as an epoxy group, an acid chloride group, etc., with a part of the copolymer of an unsaturated carboxylic acid (a) and a compound (b) having an unsaturated double bond, and then adding an ethylenically unsaturated group as a pendant;

(3) a carboxyl group-containing photosensitive resin prepared by reacting a copolymer of a compound (c) (e.g., glycidyl(meth)acrylate, α-methylglycidyl(meth)acrylate, etc.) having an epoxy group and an unsaturated double bond and a compound (b) having an unsaturated double bond with an unsaturated carboxylic acid (a), and then reacting the secondary hydroxyl group thus obtained with a saturated or unsaturated polybasic acid anhydride (d) (e.g., phthalic anhydride, tetrahydrophthalic anhydride, hexahydrophthalic anhydride, etc.);

(4) a carboxyl group-containing photosensitive resin prepared by reacting a copolymer of an acid anhydride (e) (e.g., maleic anhydride, itaconic anhydride, etc.) having an unsaturated double bond and a compound (b) having an unsaturated double bond with a compound (f) (e.g., hydroxyalkyl(meth)acrylate, etc.) having one hydroxyl group and at least one ethylenically unsaturated double bond;

(5) a carboxyl group-containing photosensitive compound prepared by an esterification reaction (i.e., a complete or partial esterification reaction, preferably a complete esterification reaction) of an epoxy group of a below-mentioned multifunctional epoxy compound (g) having at least 2 epoxy groups per molecule or a multifunctional epoxy resin obtained from additionally epoxydizing the hydroxyl group of a multifunctional epoxy compound with epichlorohydrin and a carboxyl group of an unsaturated monocarboxylic acid (h) such as (meth)acrylic acid, and then further reacting the generated hydroxyl group with a saturated or unsaturated polybasic acid anhydride (d);

(6) a carboxyl group-containing resin prepared by reacting an epoxy group of a copolymer of a compound (b) having an unsaturated double bond and glycidyl(meth)acrylate with an organic acid (i) (e.g., a $C_2$-$C_7$ alkyl carboxylic acid, an aromatic group-containing alkyl carboxylic acid, etc.) having one carboxyl group per molecule and not having any ethylenically unsaturated bond, and then reacting the generated secondary hydroxyl group with a saturated or unsaturated polybasic acid anhydride (d);

(7) a carboxyl group-containing urethane resin prepared by a poly-addition reaction of a diisocyanate compound (j) (e.g., an aliphatic diisocyanate, a branched aliphatic diisocyanate, a cyclo-aliphatic diisocyanate, an aromatic diisocyanate, etc.), a carboxyl group-containing dialcohol compound (k) (e.g., dimethylolpropionic acid, dimethylolbutanic acid, etc.), and a diol compound (m) (e.g., a polycarbonate-based polyol, an acryl-based polyol, a bisphenol-A alkylene oxide adduct diol, a compound having a phenolic hydroxyl group and an alcoholic hydroxyl group, etc.);

(8) a photosensitive, carboxyl group-containing urethane resin prepared by a poly-addition reaction of a diisocyanate compound (j), a (meth)acrylate of a bifunctional epoxy resin (e.g., a bisphenol-A epoxy resin, a hydrogenated bisphenol-A epoxy resin, a brominated bisphenol-A epoxy resin, a bisphenol-F epoxy resin, a bisphenol-S epoxy resin, a bixylenol epoxy resin, a biphenol epoxy resin, etc.) or its partially-modified acid anhydride (n), a carboxyl group-containing dialcohol compound (k), and a diol compound (m);

(9) a carboxyl group-containing urethane resin prepared by adding a compound (f) (e.g., hydroxyalkyl(meth)acrylate, etc.) having one hydroxyl group and at least one ethylenically unsaturated double bond in the synthesis of the resin (7) or (8) to introduce an unsaturated double bond at the end;

(10) a carboxyl group-containing urethane resin prepared by adding a compound (such as an equimolar reaction product of isophorone diisocyanate and pentaerythrytol triacrylate) having one isocyanate group and at least one (meth)acryloyl group per molecule in the synthesis of the resin (7) or (8) and introducing a (meth)acryl group at the end of the resultant product;

(11) a carboxyl group-containing photosensitive resin prepared by reacting a below-mentioned multifunctional oxetane compound having at least 2 oxetane rings per molecule with an unsaturated monocarboxylic acid (h), and then reacting the primary hydroxyl group of the modified oxetane compound thus obtained with a saturated or unsaturated polybasic acid anhydride (d);

(12) a carboxyl group-containing photosensitive resin prepared by introducing an unsaturated double bond into a reaction product of a bisepoxy compound and a bisphenol and then successively reacting the resultant product with a saturated or unsaturated polybasic acid anhydride (d); and

(13) a carboxyl group-containing photosensitive resin prepared by reacting a reaction product of a novolac phenol resin and an alkylene oxide (e.g., ethylene oxide, propylene oxide, butylene oxide, trimethylene oxide, tetrahydrofuran, tetrahydropyran, etc.) and/or a cyclic carbonate (e.g., ethylene carbonate, propylene carbonate, butylene carbonate, 2,3-carbonate, propylene methacrylate, etc.) with an unsaturated monocarboxylic acid (h), and then reacting the resultant product with a saturated or unsaturated polybasic acid anhydride (d).

In the aspect of the flexibility of the dry film solder resist (DFSR), the preferred acid-modified oligomers are the carboxyl group-containing resins (7) to (10) where the compound containing an isocyanate group used in the resin synthesis is a diisocyanate compound without a benzene ring; and the resins (5) and (8) where the multifunctional or bifunctional epoxy resin used in the resin synthesis is a linear compound having a bisphenol-A, bisphenol-F, biphenyl, or bixylenol backbone, or its hydrogenated compound. In another aspect, the modified products of the resins (7) to (10) that contain a urethane bond in their main chain are also preferred due to high bendability.

The aforementioned acid-modified oligomers are commercially available, such as, for example, ZAR-2000® manufactured by Nippon Kayaku Co. Ltd. in Japan.

The photosensitive resin composition may include 10 to 80 wt %, preferably 15 to 75 wt %, more preferably 25 to 65 wt % of the acid-modified oligomer. An extremely low content of the acid-modified oligomer leads to deterioration in developability and film strength and thus deterioration in the coating uniformity as well as over-development of the composition.

Further, the acid-modified oligomer may have an acid value of 40 to 120 mg KOH/g. An acid value of the acid-modified oligomer of less than 40 mg KOH/g potentially leads to difficulty in alkaline development, whereas an acid value of the acid-modified oligomer of greater than 120 mg KOH/g causes the exposed portion to be dissolved in the development solution, making the line unnecessarily thin or, in some cases, causing both the exposed portion and the unexposed portion to be dissolved in the development solution and peeled off, consequently with a failure to form a normal resist pattern.

Photopolymerizable Monomer

The photosensitive resin composition may include a photopolymerizable monomer. The use of the photopolymerizable monomer enables it to form a cured material or a cross-linked structure under radiation. Such a photopolymerizable monomer not only provides the composition with photo-curability but makes it possible to control the viscosity to be suitable for any kind of coating methods or provide appropriate solubility to an aqueous alkaline solution.

Specific examples of the photopolymerizable monomer may include: an acrylate-based compound having a hydroxyl group, such as 2-hydroxyethylacrylate, 2-hydroxypropylacrylate, pentaerythritol triacrylate, dipentaerythritol pentaacrylate, etc.; a water-soluble acrylate-based compound, such as polyethylene glycol diacrylate, polypropylene glycol diacrylate, etc.; a multifunctional polyester acrylate-based compound of polyhydric alcohol, such as trimethylol propane triacrylate, pentaerythritol tetraacrylate, dipentaerythritol hexaacrylateacrylate, etc.; an acrylate-based compound of an ethylene oxide adduct and/or a propylene oxide adduct of multifunctional alcohols (e.g., trimethylol propane, hydrogenated bisphenol A, etc.) or polyphenols (e.g., bisphenol A, biphenol, etc.); a multifunctional or monofunctional polyurethane acrylate which is an isocyanate-modified compound of the acrylate-based compound containing a hydroxyl group; an epoxy acrylate-based compound which is a (meth)acrylic acid adduct of biphenol-A glycidyl ether, hydrogenated bisphenol-A diglycidyl ether, or phenol novolac epoxy resin; a caprolactone-modified acrylate-based compound, such as caprolactone-modified ditrimethylol propane tetraacrylate, ε-caprolactone-modified dipentaerythritol acrylate, caprolactone-modified hydroxypivalic acid neopentyl glycol ester diacrylate, etc.; or a photosensitive (meth)acrylate compound, such as (meth)acrylates corresponding to the acrylates. These photopolymerizable monomers may be used alone or in a mixture of two or more.

Among these, the photopolymerizable monomer as used herein is preferably a multifunctional (meth)acrylate-based compound having at least two (meth)acrylate groups per molecule, and specifically, for example, pentaerythritol triacrylate, trimethylol propane triacrylate, dipentaerythritol hexaacrylate, caprolactone-modified ditrimethylol propane tetraacrylate, etc. Further, DPEA-12 manufactured by Nippon Kayaku Co. Ltd. is commercially available as the photopolymerizable monomer.

The photosensitive resin composition may include 1 to 30 wt % of the photopolymerizable monomer. A content of the photopolymerizable monomer of less than 1 wt % causes photocuring to insufficiently occur, while a content of the photopolymerizable monomer of greater than 30 wt % leads to deterioration in the dryness or properties of the film.

Photoinitiator

The photosensitive resin composition may include a photoinitiator. The photoinitiator is used to initiate photocuring by way of radical reaction in the exposed portion of the resin composition.

The photoinitiator as used herein may be any kind of known photoinitiators, and its specific examples may include: benzoin and its alkyl ethers, such as benzoin, benzoin methyl ether, benzoin ethyl ether, etc.; acetophenones, such as acetophenone, 2,2-dimethoxy-2-phenylacetophenone, 1,1-dichloroacetophenone, 4-(t-butyldioxy-1-methylethyl)acetophenone, etc.; anthraquinones, such as 2-methyl-anthraquinone, 2-amyl-anthraquinone, 2-t-butyl-anthraquinone, 1-chloroanthraquinone, etc.; thioxanthones, such as 2,4-dimethyl thioxanthone, 2,4-diisopropyl thioxanthone, 2-chloro-thioxanthone, etc.; ketals, such as acetophenone dimethyl ketal, benzyl dimethyl ketal, etc.; or benzophenones, such as benzophenone, 4-(1-t-butyldioxy-1-methylethyl)benzophenone, 3,3',4,4'-tetrakis(t-butyldioxycarbonyl)benzophenone, etc.

The preferred initiator may include: α-aminoacetophenones, such as 2-methyl-1-[4-(methylthio)phenyl]-2-morpholinopropanone-1,2-benzyl-2-dimethylamino-1-(4-morpholinophenyl)-butane-1-one, 2-(dimethylamino)-2-[(4-methylphenyl)methyl]-1-[4-(4-morpholinyl)phenyl]-1-butanone, or N,N-dimethylaminoacetophenone (commercially available as Irgacure® 907, Irgacure® 369, or Irugacure® 379 as manufactured by Chiba Specialty Chemicals Co., Ltd., currently Chiba Japan Co., Ltd.); or acylphosphine oxides, such as 2,4,6-trimethylbenzoyldiphenyl phosphine oxide, bis(2,4,6-trimethylbenzoyl)-phenyl phosphine oxide, bis(2,6-dimethoxybenzoyl)-2,4,4-trimethyl-pentyl phosphine oxide (commercially available as Lucirin® TPO as manufactured by BASF Corp., or Irugacure® 819 as manufacture by Chiba Specialty Chemicals Co., Ltd.).

Another preferred photoinitiator is oxime esters. The specific examples of oxime esters as used herein may include 2-(acetyloxyiminomethyl)thioxantene-9-one, (1,2-octanedione, 1-[4-(phenylthio)phenyl]-, 2-(O-benzoyloxime)), (ethanone, 1,-[9-ethyl-6-(2-methylbenzoyl)-9H-carbazole-3-yl]-, 1-(O-acetyloxime)), or the like. The photoinitiator products commercially available are GGI-325®, Irugacure® OXE01, or Irugacure® OXE02 as manufactured by Chiba Specialty Chemicals Co., Ltd., N-1919® by ADEKA Corp., or Darocur® TPO by Chiba Specialty Chemicals Co., Ltd.

The photosensitive resin composition may include 0.1 to 10 wt %, preferably 1 to 5 wt %, of the photoinitiator. An extremely low content of the photoinitiator causes photopolymerization to occur insufficiently, while an extremely high content of the photoinitiator leads to deterioration in the resolution of the resin composition or poor reliability of the prepared dry film.

Thermosetting Binder Resin

The photosensitive resin composition may also include a thermosetting binder resin having a thermally curable functional group, such as, for example, at least one functional group selected from an epoxy group, an oxetanyl group, a cyclic ether group, and a cyclic thio ether group. The thermosetting binder forms a crosslink with an acid-modified oligomer and/or a photopolymerizable monomer by way of thermocuring to secure thermal resistance or mechanical properties for the dry film solder resist or the under-fill dam.

The thermosetting binder resin may have a softening point of about 70 to 100° C., with a view to minimizing uneven lamination. An extremely low softening point of the thermosetting binder resin leads to an increase in the stickiness of the dry film solder resist (DFSR), while an extremely high softening point of the thermosetting binder resin deteriorates the fluidity of the film.

The thermosetting binder resin as used herein may include a resin having at least two cyclic ether groups or at least two cyclic thio ether groups (hereinafter, referred to as "cyclic (thio)ether groups") per molecule, or a bifunctional epoxy resin. As well, the thermosetting binder resin may also include diisocyanate or its bifunctional block isocyanate.

The thermosetting binder resin having at least two cyclic (thio)ether groups per molecule may be a compound having, per molecule, either a 3-, 4-, or 5-membered cyclic ether group or a 3-, 4- or 5-membered cyclic (thio)ether group, or at least two of the 3-, 4-, or 5-membered cyclic ether group or the 3-, 4- or 5-membered cyclic (thio)ether group. The thermosetting binder resin may also be a multifunctional epoxy compound having at least two epoxy groups per molecule; a multifunctional oxetane compound having at least two oxetanyl groups per molecule; or an episulfide resin having at least two thio ether groups per molecule.

The specific examples of the multifunctional epoxy compound may include bisphenol-A epoxy resin, hydrogenated bisphenol-A epoxy resin, brominated bisphenol-A epoxy resin, bisphenol-F epoxy resin, bisphenol-S epoxy resin, novolac epoxy resin, phenol novolac epoxy resin, cresol norvolac epoxy resin, N-glycidyl epoxy resin, bisphenol-A novolac epoxy resin, bixylenol epoxy resin, biphenol epoxy resin, chelated epoxy resin, glyoxal epoxy resin, amino group-containing epoxy resin, rubber-modified epoxy resin, dicyclopentadiene phenolic epoxy resin, diglycidylphthalate resin, heterocyclic epoxy resin, tetraglycidylxylenoyl ethane resin, silicone-modified epoxy resin, ϵ-caprolactone-modified epoxy resin, and so forth. To have inflammability, atoms, such as phosphor, may be introduced into the structure of the epoxy resins. These epoxy resins are thermally cured to enhance characteristics of the cured coating layer, such as adherence, thermal resistance during soldering, electroless plating resistance, or the like.

The specific examples of the multifunctional oxetane compound may include multifunctional oxetanes (e.g., bis [(3-methyl-3-oxetanylmethoxy)methyl]ether, bis[(3-ethyl-3-oxetanylmethoxy)methyl]ether, 1,4-bis[(3-methyl-3-oxetanylmethoxy)methyl]benzene, 1,4-bis[(3-ethyl-3-oxetanylmethoxy)methyl]benzene, (3-methyl-3-oxetanyl) methylacrylate, (3-ethyl-3-oxetanyl)methylacrylate, (3-methyl-3-oxetanyl)methylmethacrylate, (3-ethyl-3-oxetanyl)methylmethacrylate, or their oligomers or copolymers), oxetane alcohol and novolac resin, poly(p-hydroxystyrene), cardo-type bisphenols, calixarenes, calixresorcinarenes, or ethers with a resin having a hydroxyl group (e.g., silsesqui-oxane). Other specific examples of the multifunctional oxetane compound may include a copolymer of an unsaturated monomer having an oxetane ring and alkyl(meth)acrylate.

The specific examples of the compound having at least two cyclic thioether groups, among the above-mentioned molecules, may include a bisphenol-A episulfide resin, YL7000® manufactured by Japan Epoxy Resin Co., Ltd; or an episulfide resin in which the oxygen atom of the epoxy group of the novolac epoxy resin is substituted with a sulfur atom.

Another one that is commercially available is YCDN-500-80P® manufactured by Kukdo Chemical Co., Ltd.

The photosensitive resin composition may include 1 to 30 wt % of the thermosetting binder resin. A content of the thermosetting binder resin of less than 1 wt % leads to deterioration in the mechanical properties of the dry film, and a content of the thermosetting binder resin of greater than 30 wt % leads to deterioration in the developability of the resin composition.

Organic Solvent

The photosensitive resin composition may use the individual ingredients in combination with at least one organic solvent in order to dissolve the ingredients or provide adequate viscosity.

The specific examples of the organic solvent may include ketones, such as methylethyl ketone, cyclohexanone, etc.; aromatic hydrocarbons, such as toluene, xylene, tetramethylbenzene, etc.; glycol ethers (cellosolve), such as ethylene glycol monoethyl ether, ethylene glycol monomethyl ether, ethylene glycol monobutyl ether, diethylene glycol monoethyl ether, diethylene glycol monomethyl ether, diethylene glycol monobutyl ether, propylene glycol monomethyl ether, propylene glycol monoethyl ether, dipropylene glycol diethyl ether, triethylene glycol monoethyl ether, etc.; acetic esters, such as ethyl acetate, butyl acetate, ethylene glycol monoethyl ester acetate, ethylene glycol monobutyl ether acetate, diethylene glycol monoethyl ether acetate, diethylene glycol monobutyl ether acetate, propylene glycol monomethyl ether acetate, dipropylene glycol monomethyl ether acetate, etc.; alcohols, such as ethanol, propanol, ethylene glycol, propylene glycol, carbitol, etc.; aliphatic hydrocarbons, such as octane, decane, etc.; petroleum solvents, such as petroleum ether, petroleum naphtha, hydrogenated petroleum naphtha, naphtha solvents, etc.; or amides, such as dimethylacetamide, dimethylformamide (DMF), etc. These solvents may be used alone or in a mixture of at least two.

The photosensitive resin composition may include about 5 to 50 wt % of the organic solvent. An extremely low content of the organic solvent leads to an extremely high viscosity of the composition, deteriorating the coatability, whereas an extremely high content of the organic solvent leads to insufficient drying to deteriorate the properties of the dry film solder resist or increase the stickiness of the dry film solder resist.

Pigment

To color the under-fill dam white, Pigment White 6 which is titanium dioxide can be used as a pigment. Titanium dioxide used as a white pigment can be manufactured in two forms: anatase and rutile. The anatase type titanium dioxide is superior in white chromaticity to the rutile type titanium dioxide but is susceptible to yellowing under exposure to light due to its optical activity. It is therefore preferable to use rutile type titanium dioxide which is somewhat poor in white chromaticity but does not have optical activity.

To color the under-fill dam yellow, the pigment as used herein can be anthraquinone pigments, isoindolinone pigments, condensed azo pigments, or benzimidazolone pigments. The specific examples of the yellow pigments may include pigment yellow 108, pigment yellow 147, pigment yellow 151, pigment yellow 166, pigment yellow 181, pigment yellow 193, and so forth.

To color the under-fill dam green, the specific examples of the green pigments as used herein may include pigment green 7, pigment green 36, solvent green 3, solvent green 5, solvent green 20, solvent green 28, and so forth. But the green pigments have problems regarding the existence of halogens. Hence, an appropriate combination of yellow and blue pigments can be applied in order to make a green color.

To color the under-fill dam black, the specific examples of the black pigments as used herein may include carbon black, titanium black, chromium oxide, iron oxide, aniline black, perylene black, and so forth.

To color the under-fill red, the specific examples of the red pigments as used herein may include pigment red 13, pigment red 32, pigment red 122, pigment red 177, pigment red 185, pigment red 226, pigment red 246, and so forth.

The photosensitive resin composition may include 0.01 to 10 wt %, preferably 1 to 5 wt %, of the pigment. An extremely low content of the pigment leads to deterioration in visibility and hiding power, whereas an extremely high content of the pigment leads to deterioration in mechanical properties such as thermal resistance.

In the case of using a white pigment, which also functions as a filler in itself, the content of the white pigment may be 50 wt % or less with respect to the total weight of the photosensitive resin composition, excluding other inorganic fillers.

On the other hand, the photosensitive resin composition may further include the following optional ingredients in addition to the above-mentioned ingredients.

Curing Agent for Thermosetting Binder Resin

The photosensitive resin composition may further include a curing agent for a thermosetting binder resin for selectively enhancing the degree of cure for the thermosetting binder resin.

The specific examples of the curing agent for thermosetting binder resin as used herein may include amines, acid anhydrides, amides, phenols, and so forth. The specific examples of the amines may include diaminodiphenylmethane, diethylene triamine, triethylene tetraamine, diaminodiphenylsulfone, isophorone diamine, or the like. The specific examples of the acid anhydrides may include phthalic anhydride, trimellic anhydride, pyromellitic anhydride, maleic anhydride, tetrahydrophthalic anhydride, methyltetrahydrophthalic anhydride, methyl nadic anhydride, hexahydrophthalic anhydride, methyl hexahydrophthalic anhydride, or the like. The specific examples of the amides may include dicyandiamide, a polyamide resin synthesized from 2 equivalents of linoleic acid and ethylene diamine, or the like. The specific examples of the phenols may include polyphenols (e.g., bisphenol A, bisphenol F, bisphenol S, fluorene bisphenol, terpene diphenol, etc.); phenol resins synthesized by condensation of phenols and aldehydes, ketones, or dienes; phenol resins synthesized by polycondensation of phenols and substituted biphenyls or substituted phenols; modified products of phenols and/or phenol resins; halogenated phenols (e.g., tetrabromobisphenol A, brominated phenol resin, etc.); or others (e.g. amidazols, BF3-amine complex, guanidine derivatives, etc.).

The photosensitive resin composition may further include 0.01 to 15 wt % of the curing agent for the thermosetting binder resin. An extremely low content of the curing agent for thermosetting binder resin leads to an insignificant effect of enhancing the degree of cure for the epoxy resin, whereas an extremely high content of the curing agent for the thermosetting binder resin causes deterioration in the properties of the dry film.

Catalyst for Thermosetting Binder Resin

The catalyst for the photosensitive resin composition can enhance the curing rate of the thermosetting binder resin.

The specific examples of the catalyst for the thermosetting binder resin as used herein may include: imidazole derivatives, such as imidazole, 2-methyl imidazole, 2-ethyl imidazole, 2-ethyl-4-methyl imidazole, 2-phenyl imidazole, 4-phenyl imidazole, 1-cyanoethyl-2-phenyl imidazole, 1-(2-cyanoethyl)-2-ethyl-4-methyl imidazole, etc.; amine compounds, such as dicyandiamide, benzylmethyl amine, 4-(dimethylamino)-N,N-dimethylbenzyl amine, 4-methoxy-N,N-dimethylbenzyl amine, 4-methyl-N,N-dimethylbenzyl amine, etc.; hydrazine compounds, such as adipic dihydrazide, sebasic dihydrazide, etc.; or phosphor compounds, such as triphenylphosphine, etc. The specific examples of the catalyst for the thermosetting binder resin commercially available are imidazole products manufactured by Shikoku Kasei Kogyo Co., Ltd., such as 2MZ-A®, 2MZ-OK®, 2PHZ®, 2P4BHZ®, or 2P4 MHZ®; block isocyanate compounds of dimethylamine manufactured by San-Apro Ltd., such as U-CAT3503N® or UCAT3502T®; or bicyclic amidine compounds and their salts manufactured by San-Apro Ltd., such as DBU®, DBN®, U-CATSA102®, or U-CAT5002®. The curing catalysts for the thermosetting binder resin as used herein are not specifically limited to the foregoing ones and may include any thermocuring catalyst for epoxy resins or oxetane compounds, or any thermocuring catalyst for accelerating the reaction of an epoxy group and/or an oxetanyl group and a carboxyl group. The thermocuring catalyst may be used alone or in a mixture of at least two. The thermocuring catalysts as used herein may also include S-triazine derivatives, such as guanamine, acetoguanamine, benzoguanamine, melamine, 2,4-diamino-6-methacryloyloxyethyl-S-triazine, 2-vinyl-4,6-diamino-S-triazine, adducts of 2,-vinyl-4,6-diamino-S-triazine and isocyanuric acid, or adducts of 2,4-diamino-6-methacryloyloxyethyl-S-triazine and isocyanuric acid. Preferably, those compounds that also function as an agent for providing adherence can be used in combination with the catalysts for the thermosetting binder resin.

The content of the catalyst for the thermosetting binder resin as used herein may be in the range of about 0.3 to 15 wt % with respect to the total weight of the photosensitive resin composition in a view of providing adequate thermocurability.

Filler

The filler takes a role of enhancing thermal stability, dimensional stability under heat, and adhesive strength of the resin. The filler also reinforces the color and functions as an extender pigment.

The filler as used herein may include inorganic or organic fillers, such as, for example, barium sulfate, barium titanate, amorphous silica, crystalline silica, fused silica, spherical silica, talc, clay, magnesium carbonate, calcium carbonate, aluminum oxide (alumina), aluminum hydroxide, mica, or the like.

The content of the filler as used herein is preferably about 5 to 50 wt % with respect to the total weight of the photosensitive resin composition. A content of the filler of greater than 50 wt % undesirably leads to an increase in the viscosity of the composition to deteriorate the coatability or the degree of cure.

Leveling Agent

The leveling agent is used to eliminate popping or craters on the surface of the resin coating applied on the film.

The leveling agent as used herein may include silicon compounds, fluorine compounds, or polymers, such as, for example, BYK-380N®, BYK-307®, BYK-378®, or BYK-350®, as manufactured by BYK-Chemie GmbH.

The content of the leveling agent as used herein is preferably 0.05 to 10 wt % with respect to the total weight of the photosensitive resin composition. A content of the leveling agent of less than 0.05 wt % is too insufficient to eliminate popping or craters, and a content of the level agent of greater than 10 wt % leads to many bubbles in the film.

Dispersing Agent

The dispersing agent is used to enhance the dispersion stability of the filler or the pigment.

The specific examples of the dispersing agent as used herein may include Disperbyk-110®, Diperbyk-162®, or Disperbyk-168®, as manufactured by BYK-Chemie GmbH.

The content of the dispersing agent as used herein is preferably 0.01 to 10 wt % with respect to the total weight of the photosensitive resin composition. A content of the dispersing agent of less than 0.01 wt % is too insignificant to disperse the composition, whereas a content of the dispersing agent of greater than 10 wt % adversely affects thermal resistance and reliability.

In accordance with another embodiment of the present invention, a method for fabricating a printed circuit board is provided that includes the steps of: laminating a dry film including a dried or cured material of a photosensitive resin composition on a substrate, where the photosensitive resin composition includes an acid-modified oligomer having a carboxyl group (—COOH) and a curable functional group, a photopolymerizable monomer, a photoinitiator, a thermosetting binder resin, an organic solvent, and a pigment; exposing a part of the dry film on the outer edge of the substrate; and cleaning the exposed dry film.

Using the dry film prepared from the photosensitive resin composition including the specified ingredients may result in preparation of an under-fill dam having a low and uniform thickness. Particularly, such an under-fill dam has good mechanical properties to realize height and strength at defined levels or higher, thereby preventing leaks of an under-fill material injected or filled into the printed circuit board. This minimizes potential damage to the under-fill dam or deterioration of properties possibly occurring during the under-fill process or the semiconductor fabrication process.

FIG. 1 is a schematic diagram of a general under-fill process. The conventional under-fill process includes, in sequence, an alignment and flux dispensing step, a solder bump reflow step, a flux cleaning step, and an under-filling step.

More specifically, the under-fill process may involve aligning a chip device 1 having a solder bump 2 and a substrate 4 having an electrode pad 3, dispensing a flux, reflowing the solder bump 2, cleaning the flux, and then filling an under-fill material 5 between the chip device 1 and the substrate 4.

FIG. 2 is a schematic diagram of an under-fill process using an under-fill dam which is formed with a dry film including a dried or cured material of the photosensitive resin composition. The under-fill dam is formed along the outer edge of the chip device 1, so it can keep the injected under-fill material 5 from leaking The under-fill dam can be prepared by laminating the dry film obtained from the photosensitive resin composition containing the specified ingredients on a substrate and then carry out exposure, development, and cleaning steps.

More specifically, the under-fill dam can be formed in the following sequential steps: preparing a dry film using a photosensitive resin composition; laminating the dry film between a substrate and a chip device; placing a photomask corresponding to a desired dam pattern on the dry film and exposing the dry film; developing the exposed dry film to remove unwanted portions and form a desired dam pattern; and curing the developed dry film under heat to complete a dam consisting of a dry film solder resist.

The specific ingredients included in the photosensitive resin composition are as defined above.

The dry film, which consists of, from bottom to top, a carrier film, a photoresist film, and a release film, can be prepared in the sequential steps of coating the carrier film with the photosensitive resin composition; passing the carrier film through an oven and drying it; and laminating the release film on the dried film. In this regard, the carrier film may be a polyethylene terephthalate (PET) film, and the release film is a polyethylene (PE) film.

The method of depositing or coating the photosensitive resin composition may include a known deposition method using a comma coater, a blade coater, a dip coater, a rod coater, a squeeze coater, a reverse coater, a transfer roll coater, a Gravure coater, or a spray coater. The drying temperature in the oven is preferably 70 to 110° C., and the thickness of the photoresist film formed from the photosensitive resin composition is preferably about 10 to 35 μm.

In the fabrication method for the printed circuit board, the dry film thus obtained (with the release film removed) is laminated on the substrate and then exposed using a photomask having a defined pattern so as to form an under-fill dam along the outer edge of the substrate.

The step of laminating the dry film with the release film removed may employ a vacuum laminator, a hot roll laminator, or a vacuum press. The light source as used in the exposure step may include ultraviolet (UV) light, an electron beam, or X-rays. The substrate is exposed to radiation (e.g., UV light, etc.) having a defined wavelength region.

The exposure may include selective exposure using a photomask, or direct pattern exposure with a laser direct exposure machine. After the exposure, the carrier film is peeled off. The exposure value is dependent upon the coating thickness, and preferably in the range of 0 to 1000 mJ/cm$^2$. Upon exposure, for example, the exposed portion is subjected to photocuring to form a crosslink between the acid-modified oligomer and the photopolymerizable monomer, so it is not removed by the subsequent development process. Contrarily, the unexposed portion keeps the carboxyl group and becomes ready for alkali development.

After the exposure step, the dry film is developed to remove an unwanted portion and form a desired dam pattern. In the development step subsequent to the exposure, the dry film is immersed in a development solution generally by dipping or spraying. The development solution as used herein may be an aqueous alkali solution, such as of potassium hydroxide, sodium hydroxide, sodium carbonate, potassium carbonate, sodium phosphate, sodium silicate, ammonia, amines, or the like. The dry film is developed with an aqueous alkali solution and then washed with water. This development step maintains the exposed portion of the film only.

After the step of cleaning the exposed dry film, a post-curing step for the remainder can be additionally performed. The thermocuring temperature is appropriately 100° C. or above.

The above-described fabrication steps including, for example, the preparation step for a dry film, the exposure step, or a post-curing step for the washed dry film, can provide an under-fill dam including a dried or cured material of the photosensitive resin composition. The cured material of the photosensitive resin composition may include a photocured material of the acid-modified oligomer and the photopolymerizable monomer; a thermally cured material of the acid-modified oligomer and the thermosetting binder resin; and a pigment.

The printed circuit board obtained by the fabrication method may have an under-fill dam having a thickness of 10 to 20 μm, preferably 10 to 15 μm. The thickness error (i.e., the difference between the average thickness and the maximum/minimum thickness) of the under-film dam may be 3 μm or less.

On the other hand, the fabrication method for the printed circuit board may further include the steps of: forming an electrode pad on the substrate; positioning a solder bump on the electrode bump; and mounting a semiconductor chip by flip-chip connection via the solder bump. The solder bump as connected to the top of the semiconductor chip can be positioned on the electrode pad. Alternatively, the solder bump can mounted on the electrode pad and then connected to the semiconductor chip.

Accordingly, the printed circuit board may include an electrode pad formed on the substrate; a solder bump formed on the electrode pad; and a semiconductor chip mounted by flip-chip connection via the solder bump.

The fabrication method for the printed circuit board may further include the step of injecting an under-fill material between the substrate and the semiconductor chip to provide a printed circuit board filled with the under-fill material.

Advantageous Effect of the Invention

According to the present invention, a printed circuit board and its fabrication method can be provided, in which the printed circuit board includes a thin under-fill dam having good mechanical properties and a low and uniform thickness.

DETAILS FOR PRACTICING THE INVENTION

Figure 1:
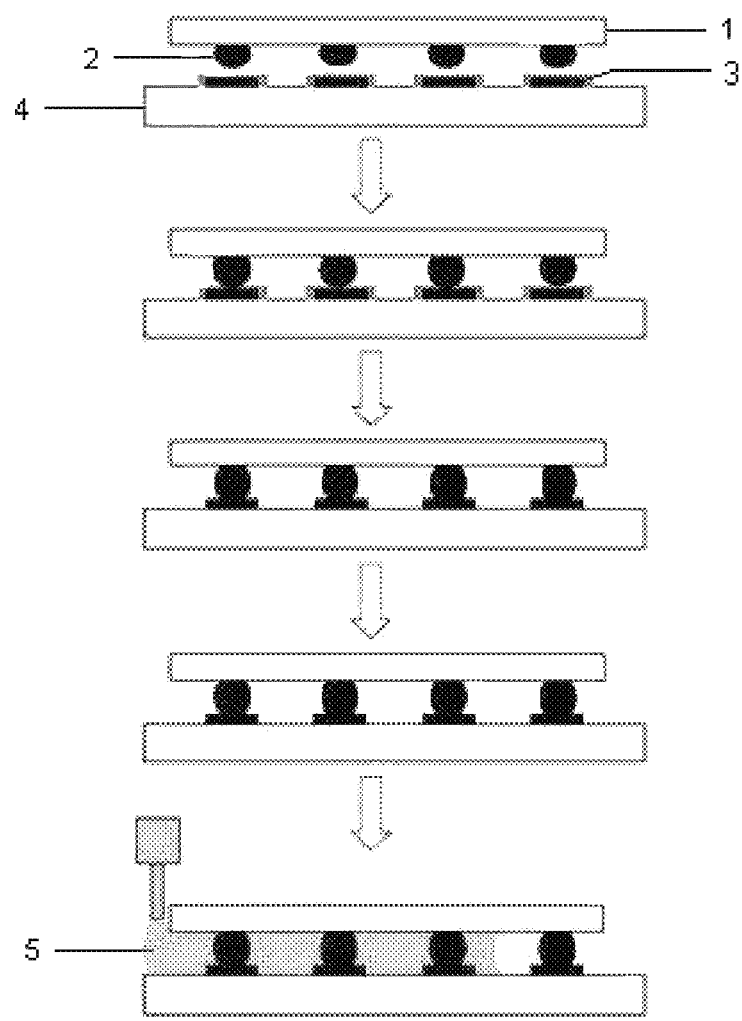
FIG. 1 is a schematic diagram of a general under-fill process.
Figure 2:
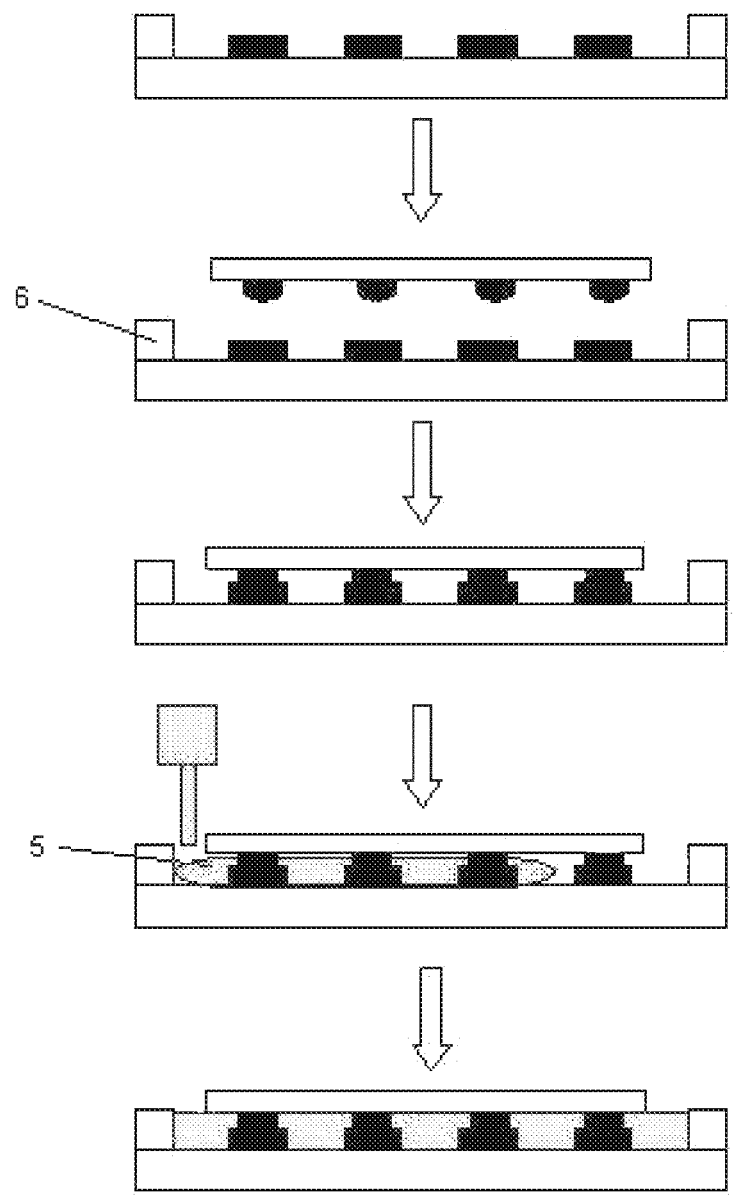
FIG. 2 is a schematic diagram of an under-fill process in the case of forming an under-fill dam on a substrate.

Hereinafter, the present invention will be described in further detail by way of the following examples, which are given for illustration only and are not intended to limit the scope of the present invention.

EXAMPLES

Fabrication of Printed Circuit Board

Example 1

(1) Preparation of Photosensitive Resin Composition

A photosensitive resin composition in a white color was prepared by mixing 35 wt % of CCR-1235® commercially available from Nippon Kayaku Co., Ltd. as an acid-modified oligomer, 13 wt % of DPEA-12® from Kayarad as a photopolymerizable monomer, 3 wt % of TPO as a photoinitiator, 13 wt % of EOCN-1020 from Nippon Kayaku Co., Ltd. as an epoxy resin, 0.5 wt % of dicyandiamide as an epoxy curing agent, 0.5 wt % of 2MI as an epoxy catalyst, 19 wt % of rutile type titanium dioxide (Tie Pure R-931® from DuPont) as a white pigment, 0.5 wt % of BYK-380N® as a leveling agent, 0.5 wt % of Disperbyk-110® as a dispersing agent, and 15 wt % of DMF as a solvent.

(2) Preparation of Dry Film

The photosensitive resin composition thus obtained was applied on a PET carrier film and dried through an oven at 75° C. Then, a PE release film was laminated on the photoresist film to complete a dry film which includes, from bottom to top, a carrier film, a photoresist film (15 μm thick), and a release film.

(3) Fabrication of Printed Circuit Board

The dry film thus obtained had a cover film removed, and the photoresist film layer was vacuum-laminated on a substrate in which a circuit was formed. A photomask corresponding to a desired under-fill dam pattern was placed on the dry film, which was then exposed to UV light, developed with an alkali solution, and the unwanted portion was removed to form a desired under-fill dam. The under-fill dam thus obtained was cured under heat to complete a printed circuit board with a dam including a dry film solder resist.

Example 2

(1) Preparation of Photosensitive Resin Composition

A photosensitive resin composition in a green color was prepared by mixing 35 wt % of CCR-1235® commercially available from Nippon Kayaku Co., Ltd. as an acid-modified oligomer, 13 wt % of DPEA-12® from Kayarad as a photopolymerizable monomer, 3 wt % of TPO as a photoinitiator, 13 wt % of EOCN-1020 from Nippon Kayaku Co., Ltd. as an epoxy resin, 0.5 wt % of dicyandiamide as an epoxy curing agent, 0.5 wt % of 2MI as an epoxy catalyst, 18 wt % of $BaSO_4$ as a filler, 0.5 wt % of a pigment blue 15:3 and 0.5 wt % of pigment yellow 151 as pigments, 0.5 wt % of BYK-380N® as a leveling agent, 0.5 wt % of Disperbyk-110® as a dispersing agent, and 15 wt % of DMF as a solvent.

(2) Preparation of Dry Film and Printed Circuit Board

The procedures were conducted in the same manner as described in Example 1, excepting that the photosensitive resin composition prepared above was used to prepare a dry film and a printed circuit board.

Example 3

(1) Preparation of Photosensitive Resin Composition

A photosensitive resin composition in a yellow color was prepared by mixing 35 wt % of CCR-1235® commercially available from Nippon Kayaku Co., Ltd. as an acid-modified oligomer, 13 wt % of DPEA-12® from Kayarad as a photopolymerizable monomer, 3 wt % of TPO as a photoinitiator, 13 wt % of EOCN-1020 from Nippon Kayaku Co., Ltd. as an epoxy resin, 0.5 wt % of dicyandiamide as an epoxy curing agent, 0.5 wt % of 2MI as an epoxy catalyst, 18 wt % of $BaSO_4$ as a filler, 1.0 wt % of pigment yellow 151 as a pigment, 0.5 wt % of BYK-380N® as a leveling agent, 0.5 wt % of Disperbyk-110® as a dispersing agent, and 15 wt % of DMF as a solvent.

(2) Preparation of Dry Film and Printed Circuit Board

The procedures were conducted in the same manner as described in Example 1, excepting that the photosensitive resin composition prepared above was used to prepare a dry film and a printed circuit board.

Comparative Example: Fabrication of Printed Circuit Board

A printed circuit board was prepared to have the same structure of Example 1, excepting that an under-fill dam was formed using the liquid solder resist disclosed in Japanese Patent Laid-Open No. 1996-325476.

Experiment Example: Measurement of Properties of Under-Fill Dam

The under-fill dams prepared in Examples and Comparative Example were compared with regard to color, thickness and uniformity, flip-chip applicability, and testability with AOI equipment. The measurement results are presented in Table 1.

TABLE 1

| | Comparative Example | Examples |
|---|---|---|
| Type | Liquid solder resist | Dry film, solder resist |
| Color | Green | White, yellow, green |
| Thickness and uniformity | Less than 1 mm, non-uniform thickness | 15 μm, uniform thickness (±2 μm) |
| Flip-chip applicability | Disabled (non-uniform thickness) | Enabled |
| Testability | Poor | Good |

As can be seen from Table 1, the Examples realized different colors, such as white, yellow, and green, while the Comparative Example was limited to a green color. Further, the Examples provide a dam having a considerably small uniform thickness at 10 to 15 μm, while the Comparative Example had a non-uniform thickness as large as about 1 mm with wide deviations.

Furthermore, the Comparative Example had difficulty in use for the flip chip because of non-uniform thickness, but the Examples which realized a small and uniform thickness was available for flip-chip applications. In addition, the Examples were superior in detection probability using AOI equipment to the Comparative Example which was limited in color.

DESCRIPTION OF REFERENCE NUMERALS AND SIGNS

1: Chip device
2: Solder bump
3: Electrode pad
4: Substrate
5: Under-fill
6: Dam

What is claimed is:

1. A printed circuit board comprising:
an under-fill dam formed along an outer edge of a substrate containing a semiconductor chip, the under-fill dam comprising a dry film solder resist,
wherein the dry film solder resist comprises a dried or cured material of a photosensitive resin composition, and the photosensitive resin composition comprising an acid-modified oligomer having a carboxyl group (—COOH) and a photocurable functional group, a photopolymerizable monomer, a thermosetting binder resin, and a pigment,
wherein the under-fill dam has at least one color selected from the group consisting of white, yellow, green, black, and red,
the under-fill dam has a different color from the substrate or solder resist on the substrate,
the under-fill dam has a thickness of 10 to 20 μm,
the thickness of the under-fill dam has a variance of 3 μm or less, and
the pigment comprises at least one pigment selected from the group consisting of rutile type titanium dioxide, isoindolinone pigments, benzimidazolone pigments, pigment green 7, pigment green 36, solvent green 3, solvent green 5, solvent green 20, solvent green 28, combination of yellow and blue pigment, chromium oxide, iron oxide, aniline black, perylene black, pigment red 13, pigment red 32, pigment red 122, pigment red 177, pigment red 185, pigment red 226, and pigment red 246.

2. The printed circuit board as claimed in claim 1, wherein the cured material of the photosensitive resin composition comprises: a photocured material of the acid-modified oligomer and the photopolymerizable monomer; a thermally cured material of the acid-modified oligomer and the thermosetting binder resin; and a pigment.

3. The printed circuit board as claimed in claim 1, further comprising:
an electrode pad formed on the substrate;
a solder bump formed on the electrode pad; and
a semiconductor chip mounted by flip-chip connection via the solder bump.

4. The printed circuit board as claimed in claim 1, wherein the under-fill dam prevents leakage of an under-fill material filled in a gap between the substrate and the semiconductor chip.

5. The printed circuit board as claimed in claim 3, wherein the under-fill dam is formed between the outer edge of the substrate and an outer edge of the semiconductor chip,
the under-fill dam having a height equal to or greater than the distance between the substrate and the semiconductor chip.

6. The printed circuit board as claimed in claim 1, wherein the photocurable functional group of the acid-modified oligomer is an acrylate group.

7. The printed circuit board as claimed in claim 1, wherein the acid-modified oligomer is a copolymer of a polymerizable monomer having a carboxyl group and a monomer comprising an acrylate-based compound.

8. The printed circuit board as claimed in claim 1, wherein the acid-modified oligomer has an acid value of 40 to 120 mg KOH/g.

9. The printed circuit board as claimed in claim 1, wherein the photopolymerizable monomer comprises at least one compound selected from the group consisting of an acrylate-based compound containing an hydroxyl group; an aqueous acrylate-based compound; a multifunctional polyester acrylate-based compound of polyhydric alcohol; an acrylate-based compound of an ethylene oxide adduct of a multifunctional alcohol or a polyphenol; an acrylate-based compound of a propylene oxide adduct of a multifunctional alcohol or a polyphenol; a multifunctional or monofunctional polyurethane acrylate; an epoxyacrylate-based compound; a caprolactone-modified acrylate-based compound; and a photosensitive (meth)acrylate-based compound.

10. The printed circuit board as claimed in claim 1, wherein the photoinitiator comprises at least one selected from the group consisting of benzoin or an alkyl ether thereof, an acetophenone thereof, an anthraquinone thereof, a thioxantone thereof, a ketal thereof, a benzophenone thereof, an α-aminoacetophenone thereof, an acylphosphine oxide thereof, and an oxime ester thereof.

11. The printed circuit board as claimed in claim 1, wherein the thermosetting binder resin comprises a compound having at least one substituent selected from the group consisting of an epoxy group, an oxetanyl group, a cyclic ether group, and a cyclic thio-ether group.

12. The printed circuit board as claimed in claim 1, wherein the photosensitive resin composition further comprises a photoinitiator and an organic solvent.

13. The printed circuit board as claimed in claim 12, wherein the photosensitive resin composition comprises:
10 to 80 wt % of an acid-modified oligomer having a carboxyl group (—COOH) and a photocurable functional group;
1 to 30 wt % of a photopolymerizable monomer;
0.1 to 10 wt % of a photoinitiator;
1 to 30 wt % of a thermosetting binder resin;
0.01 to 10 wt % of a pigment; and
5 to 50 wt % of a solvent.

* * * * *